(12) United States Patent
Sibbald et al.

(10) Patent No.: US 10,009,694 B2
(45) Date of Patent: Jun. 26, 2018

(54) MEMS MICROPHONE ASSEMBLY

(71) Applicant: Incus Laboratories Limited, Buckinghamshire (GB)

(72) Inventors: Alastair Sibbald, Cookham (GB); Peter John McCutcheon, Wallingford (GB); Robert Alcock, Thames (GB); David Monteith, Buckinghamshire (GB)

(73) Assignee: INCUS LABORATORIES LIMITED, Buckinghamshire (GB)

( * ) Notice: Subject to any disclaimer, the term of this patent is extended or adjusted under 35 U.S.C. 154(b) by 0 days. days.

(21) Appl. No.: 15/669,473

(22) Filed: Aug. 4, 2017

(65) Prior Publication Data
US 2018/0041843 A1    Feb. 8, 2018

(30) Foreign Application Priority Data
Aug. 5, 2016    (GB) .................................. 1613508.9

(51) Int. Cl.
| | | |
|---|---|---|
| *H04R 19/04* | (2006.01) | |
| *H04R 19/00* | (2006.01) | |
| *G10K 11/178* | (2006.01) | |
| *B81B 7/00* | (2006.01) | |
| *H04M 1/03* | (2006.01) | |

(52) U.S. Cl.
CPC ........... *H04R 19/04* (2013.01); *B81B 7/0061* (2013.01); *G10K 11/1782* (2013.01); *H04R 19/005* (2013.01); *B81B 2201/0257* (2013.01); *B81B 2207/012* (2013.01); *G10K 2210/1081* (2013.01); *G10K 2210/3011* (2013.01); *H04M 1/03* (2013.01); *H04R 2201/003* (2013.01)

(58) Field of Classification Search
CPC .......... H04R 19/005; H04R 1/02; H04R 1/08; H04R 1/38; H04R 31/00; H04R 2201/003
USPC .................................... 381/71.6, 355, 357
See application file for complete search history.

(56) References Cited

U.S. PATENT DOCUMENTS

| | | |
|---|---|---|
| 8,989,424 B2 | 3/2015 | Sibbald et al. |
| 2004/0013273 A1 | 1/2004 | Vaishya et al. |
| 2010/0226505 A1 | 9/2010 | Kimura |
| 2014/0294182 A1 | 10/2014 | Axelsson et al. |

(Continued)

FOREIGN PATENT DOCUMENTS

| | | |
|---|---|---|
| GB | 2445388 A | 7/2008 |
| GB | 2475526 A | 5/2011 |

(Continued)

OTHER PUBLICATIONS

Search Report dated Aug. 18, 2016 in related GB Patent Application No. 1613508.9, 4 page.

*Primary Examiner* — Melur Ramakrishnaiah
(74) *Attorney, Agent, or Firm* — Cantor Colburn LLP (57) ABSTRACT

A MEMS microphone assembly has an enclosure enclosing a volume of air. A MEMS microphone chip is provided within the enclosure. First and second acoustic ports are formed in the enclosure, defining first and second fluid paths between the volume of air and air outside the enclosure. The MEMS microphone responds to a pre-determined linear interpolative value between two independent pressure signals supplied via first and second ports according to the potentiometric ratio of the acoustic impedances of the first and second ports.

15 Claims, 4 Drawing Sheets

(56) References Cited

U.S. PATENT DOCUMENTS

2015/0010191 A1* 1/2015 Baumhauer, Jr. ........ H04R 1/04
381/355

FOREIGN PATENT DOCUMENTS

| GB | 2526945 A | 12/2015 |
|----|-----------|---------|
| JP | 2009278167 A | 11/2009 |

* cited by examiner

MEMS MICROPHONE ASSEMBLY

CROSS REFERENCE TO RELATED APPLICATIONS

This patent application claims priority to UK Patent Application No. GB1613508.9, filed Aug. 5, 2016, which is incorporated herein by reference in its entirety.

INTRODUCTION

The subject disclosure relates generally to microphone assemblies and in particular to micro-electrical-mechanical system (MEMS) microphone assemblies.

MEMS microphone assemblies are available in compact packaging, which makes them useful in applications such as headset microphones and noise-cancelling headphones.

The physical dimensions of the MEMS microphone transducer itself might be as small as 1 mm×2 mm, and have a thickness of only 1 mm. To protect the MEMS microphone transducer and supply it in a form that can be re-flow soldered for assembly into, for example, cellular phone handsets, each MEMS microphone transducer is packaged by bonding it on to a miniature PCB-type substrate. Appropriate acoustic seals are formed around the microphone and then an upper casing is sealed and bonded to the PCB substrate. The upper casing contains one or more micro-apertures which act as inlet ports to the microphone, connecting the external ambient air to the air within the package, and so to the microphone itself. The encapsulated package is very small. For example, the dimensions of the Knowles Electronics digital MEMS microphone type SPK0415HM4H are 3.00 mm×4.00 mm×1.06 mm.

One configuration of MEMS microphones is called a "top port configuration", in which a rear-volume of air behind the microphone diaphragm is coupled to a front-volume of air within the package via a very small acoustic path having a very high acoustic impedance. This acoustic path is created during the silicon fabrication process and consists of a number of microscopic apertures, typically 20 μm in diameter, in parallel with the microphone diaphragm. The acoustic path prevents stress and rupture of the microphone diaphragm during temperature changes by providing a leakage path for expanding or contracting air. The microphone responds solely to the front-volume air pressure levels.

Some MEMS microphones are mounted in a reversed format, known as a "bottom port configuration", to save space and/or increase sensitivity. In a bottom port configuration the rear face of the microphone diaphragm is exposed to the ambient air. The microphone's front-volume of air is connected to the rear-volume of air via a very high impedance acoustic path, for the same safety reasons as described above for the top-port configuration.

In both the "top-port" and "bottom-port" configurations, the MEMS microphone responds to a single, ambient air pressure signal alone. MEMS microphones in either a top-port configuration or a bottom-port configuration have a single inlet port and generate an electrical signal that is proportional to the sound pressure level (SPL) at the inlet port (Equation [1]). There is no air pathway through the microphone.

$$V\_OUT \propto [SPL]\_{inlet1} \qquad \text{Equation [1]}$$

A further type of MEMS microphone configuration is known as a "unidirectional" type, in which the front-volume of air, in front of the microphone diaphragm, is coupled to the external ambient air via a first port. The rear-volume of air, behind the microphone diaphragm, is coupled to the external ambient air via a second port. As a consequence the net force on the microphone diaphragm is dependent on the difference between the pressures at each port, and so the resultant microphone signal represents the pressure difference between the two ports (it is a differential microphone). In unidirectional microphone configurations there is no airflow path from the front-volume to the rear-volume in the microphone; airflow is blocked by the microphone diaphragm.

Microphones of the unidirectional type are often mounted in a casing or baffle for use near the lips of a user such that the close-proximity voice signal is closer to one microphone port than the other (and hence the signal is larger at that port than the other one), whereas background noise is present equally at both ports. As a consequence, the resultant difference signal from the microphone contains predominantly the voice signal, because the background noise signal is present at equal levels on both sides of the microphone diaphragm, such that there is no net pressure difference, and hence there is little or no background noise signal.

In the "unidirectional" configuration, microphones have two inlet ports, generally on the uppermost and lowermost faces of their casing or packaging, and generate an electrical signal that is proportional to the difference in SPL between the two inlet ports (Equation [2]). There is no air pathway through the microphone between the ports.

$$V\_OUT \propto [SPL]\_{(inlet1)} - [SPL]\_{inlet2} \qquad \text{Equation [2]}$$

For the purpose of clarity, present MEMS terminology is as follows. A manufacturer may supply a MEMS microphone as a "component", suitable for handling and use in manufacturing. The MEMS "component" comprises a silicon MEMS chip, which is the actual transducer itself; mounted on to a suitable substrate for electrical interconnections and additional components, and then formed into an enclosing "package" that is suitable for testing, distribution and handling.

In this present disclosure, the term MEMS "assembly" will refer to the MEMS component (i.e. chip, packaging and all), and the term MEMS "chip" will refer to the transducer itself.

SUMMARY

In one exemplary embodiment, a micro-electro-mechanical (MEMS) microphone assembly is provided. The microphone assembly includes an enclosure, a MEMS microphone chip, a first acoustic port, and a second acoustic port. The enclosure encloses a first volume of air. The MEMS microphone chip is provided within the enclosure. The first acoustic port is formed in the enclosure. The first acoustic port defines a first fluid path between the first volume of air and ambient air outside the enclosure adjacent the first acoustic port. The first port has a first acoustic impedance. The second acoustic port is formed in the enclosure and is spaced apart from the first acoustic port. The second acoustic port defines a second fluid path between the first volume of air and ambient air outside the enclosure adjacent the second acoustic port. The second port has a second acoustic impedance.

In addition to one or more of the features described herein, the first acoustic port comprises a single aperture formed in the enclosure.

In addition to one or more of the features described herein, the first and second acoustic ports each comprise a single aperture formed in the enclosure.

In addition to one or more of the features described herein, the second acoustic port comprises a plurality of apertures formed in the enclosure.

In addition to one or more of the features described herein, the first and second acoustic ports are both formed in the same surface of the enclosure.

In addition to one or more of the features described herein, the first and second acoustic ports are formed in opposite surfaces of the enclosure.

In addition to one or more of the features described herein, at least one of the first and second acoustic ports further comprises an acoustically resistive material.

In addition to one or more of the features described herein, a ratio of the first and second acoustic impedances is at least 5:1.

In addition to one or more of the features described herein, a ratio of the first and second acoustic impedances is at least 10:1.

In addition to one or more of the features described herein, signal-processing circuitry is provided within the enclosure.

In another exemplary embodiment, an ambient noise-cancelling system is provided. The ambient noise-cancelling system includes a micro-electro-mechanical microphone assembly that includes an enclosure, a MEMS microphone chip, a first acoustic port, and a second acoustic port. The enclosure encloses a first volume of air. The MEMS microphone chip is provided within the enclosure. The first acoustic port is formed in the enclosure. The first acoustic port defines a first fluid path between the first volume of air and ambient air outside the enclosure adjacent the first acoustic port. The first port has a first acoustic impedance. The second acoustic port is formed in the enclosure and is spaced apart from the first acoustic port. The second acoustic port defines a second fluid path between the first volume of air and ambient air outside the enclosure adjacent the second acoustic port. The second port has a second acoustic impedance.

In addition to one or more of the features described herein, the microphone assembly as previously described is incorporated in an earphone.

In addition to one or more of the features described herein, the microphone assembly as previously described is incorporated in a headphone.

In another exemplary embodiment, a cellular network phone handset is provided. The cellular network phone handset includes a micro-electro-mechanical microphone assembly that includes an enclosure, a MEMS microphone chip, a first acoustic port, and a second acoustic port. The enclosure encloses a first volume of air. The MEMS microphone chip is provided within the enclosure. The first acoustic port is formed in the enclosure. The first acoustic port defines a first fluid path between the first volume of air and ambient air outside the enclosure adjacent the first acoustic port. The first port has a first acoustic impedance. The second acoustic port is formed in the enclosure and is spaced apart from the first acoustic port. The second acoustic port defines a second fluid path between the first volume of air and ambient air outside the enclosure adjacent the second acoustic port. The second port has a second acoustic impedance.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses.

Exemplary embodiments of the present disclosure provide MEMS microphone assemblies that respond to a pre-determined linear interpolative value between two independent pressure signals supplied via different ports. The MEMS microphone assembly has two ports as will be described hereafter, and which generates a signal that is proportional to a pre-determined linear interpolative value between the sound pressure level (SPL) at each of the two ports, according to Equation [3]. An air pathway also exists through the device, between the two ports.

$$V\_OUT \propto \{y/(y+x)\}(SPL\_inlet1 - SPL\_(inlet\ 2)) + SPL\_inlet1 \qquad \text{Equation [3]}$$

Figure 1A:
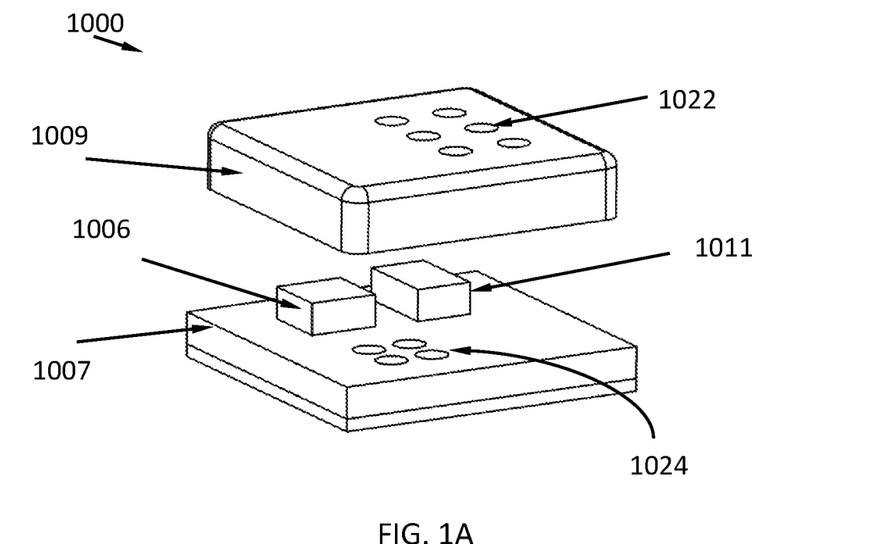
FIG. 1A shows an isometric, disassembled view of a first MEMS microphone assembly according to a first embodiment of the present disclosure.
Figure 1B:
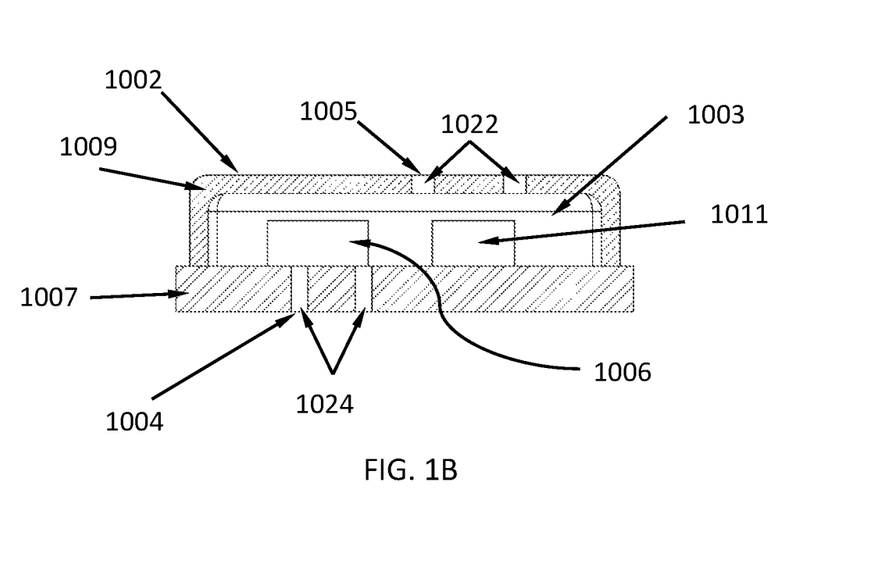
FIG. 1B shows a front-elevation sectional view through the microphone assembly of FIG. 1A.

FIGS. 1A & 1B show a MEMS microphone assembly 1000 comprising an enclosure 1002 enclosing a first volume of air 1003. The enclosure 1002 may be formed from a substrate 1007 and an upper casing 1009.

A MEMS microphone chip 1006 is provided within the enclosure 1002 and mounted on the substrate 1007. The substrate 1007 may be a miniature printed-wiring-board (PWB). The MEMS microphone chip 1006—depending on its specification—is typically accompanied by an ancillary integrated-circuit 1011 for carrying out some initial signal processing (such as A-D conversion, pre-amplification, multiplexing or other signal-processing).

The upper casing 1009 may be formed from metal to provide electrical screening. The upper casing 1009 is bonded to the substrate 1007 and sealed around its edges so as to enclose the first volume of air 1003 therebetween. The MEMS microphone chip 1006 and associated circuitry are surrounded by the first volume of air 1003.

A first acoustic port 1004 is formed in the enclosure 1002. In the embodiment illustrated in FIG. 1B, the first acoustic port 1004 comprises one or more apertures 1024 in the substrate 1007. The apertures 1024 may be a small array of small-diameter apertures. The first acoustic port has a first acoustic impedance defined by the number and size of the apertures 1024 and the thickness of the substrate 1007 through which the apertures 1024 are formed.

The first acoustic port 1004 defines a first fluid path between the first volume of air 1003 and ambient air outside the enclosure 1002 adjacent the first acoustic port 1004, namely air below the substrate 1007.

A second acoustic port 1005 is formed in the enclosure 1002. In the embodiment illustrated in FIG. 1B, the second acoustic port 1005 comprises one or more apertures 1022 formed in the upper casing 1009. The apertures 1022 may be a small array of small-diameter apertures. The second acoustic port 1005 has a second acoustic impedance defined by the number and size of the apertures 1022 and the thickness of the upper casing 1009 through which the apertures 1022 are formed.

The second acoustic port 1005 defines a second fluid path between the first volume of air 1003 and ambient air outside the enclosure 1002 adjacent the second acoustic port 1005, namely air above the upper casing 1009.

The embodiment of FIGS. 1A & 1B provides a MEMS microphone assembly 1000, which incorporates a MEMS-based acoustic potentiometer wherein the potentiometric fraction is defined by a ratio of the acoustic impedances of the first and second acoustic ports 1004 and 1005. The first and second acoustic ports 1004, 1005 are provided on opposite sides of the enclosure 1002 in the embodiment of FIGS. 1A & 1B.

In general, it is preferred to incorporate some degree of acoustic resistance into the first and second acoustic ports 1004 and 1005 to reduce Helmholtz resonance effects. In terms of acoustic impedances, small apertures and short-length apertures behave primarily as acoustic inertances. As the diameter of an aperture or tube decreases, the frictional interactions between the air and the sidewalls of the tube begin to become significant and this increases the resistive component of their complex impedance. For short path-lengths through a sidewall or casing (say, less than 2 mm) then the acoustic resistance becomes significant when the diameter is less than 0.2 mm or thereabouts. For example, at 1 kHz, a 0.2 mm aperture in a 0.2 mm thick substrate has a resistive component of 665.2 acoustic ohms (CGS units), and a reactive component of 873.2 acoustic ohms (CGS). Accordingly, by the use of small diameter apertures alone, a stable and precise device can be manufactured without the need for resistive mesh overlays.

The potentiometric ratio of the embodiment described above is defined by the impedances of the two acoustic ports 1004, 1005, which in turn, are determined by the number and dimensions of the apertures 1024, 1022 forming each port. For example, if the apertures are all, say, 0.2 mm in diameter and 0.2 mm in length, then an array of 5 apertures in the substrate 1007 and 45 apertures in the upper casing 1009 would provide a potentiometric fraction of 45/(45+5)=0.9. In other words, the ratio of the first and second acoustic impedances is 9:1 in this example. In at least one embodiment, the ratio of the first and second acoustic impedances is at least 5:1 or is at least 10:1.

Figure 2A:
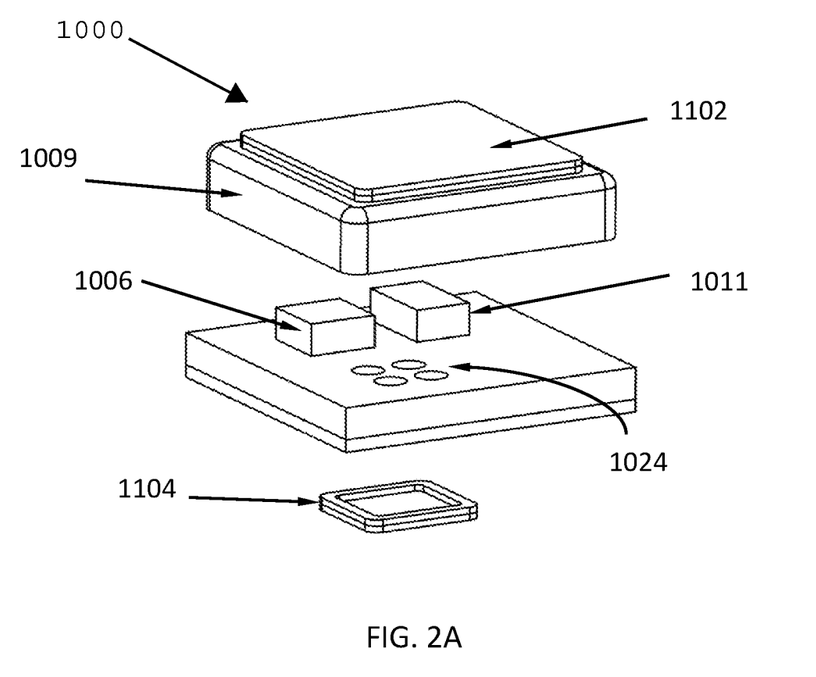
FIG. 2A shows an isometric, disassembled view of a second MEMS microphone assembly according to a second embodiment of the present disclosure.
Figure 2B:
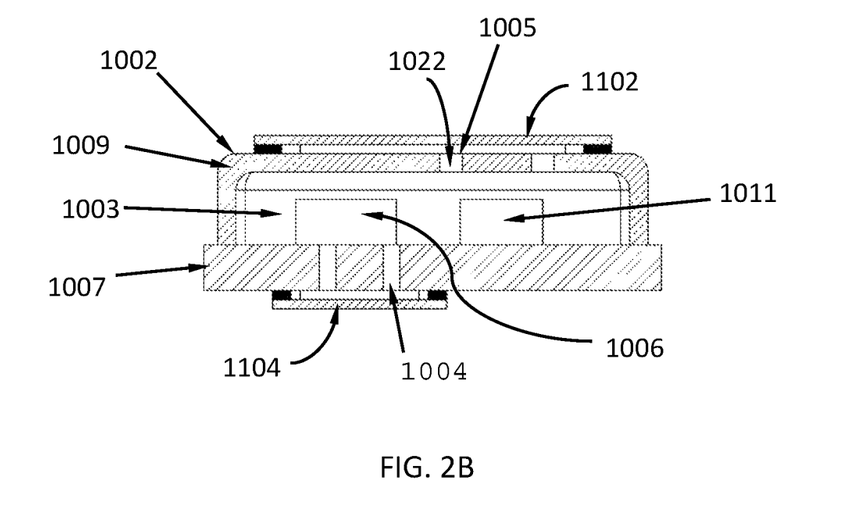
FIG. 2B shows a front-elevation sectional view through the module of FIG. 2A.

Referring now to FIGS. 2A & 2B, a further embodiment of the present disclosure is illustrated. This further embodiment is of the same general form as the embodiment of FIGS. 1A & 1B with like reference numerals denoting like parts. Further, an uppermost resistive mesh layer 1102 is provided on the upper casing 1009 and a lowermost resistive mesh layer 1104 provided on the substrate 1007. The resistive mesh layers 1102, 1104 contribute to the impedances of the first and second acoustic ports 1004, 1005 respectively. The use of resistive mesh layers may be preferred by some manufacturers, for damping or other reasons.

In FIGS. 1A, 1B, 2A and 2B, some detail of the assembly has been omitted for clarity. For example, solder bumps and interconnects are not shown.

Figure 3:
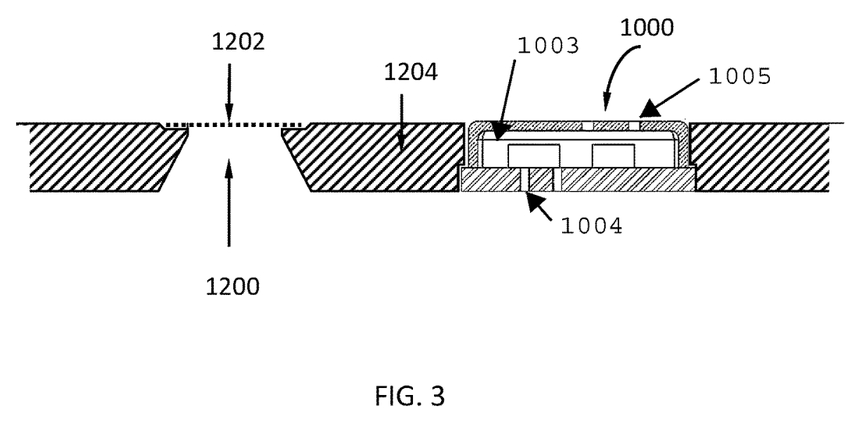
FIG. 3 shows a diagram of the microphone assembly of FIGS. 1A & 1B in an example installation in accordance with embodiments of the present disclosure.

Referring now to FIG. 3, an example installation of the MEMS microphone assembly 1000 is shown. The MEMS microphone assembly 1000 is provided in a body 1204, which in the example installation may be the body of a headphone. An air pathway is provided through the MEMS microphone assembly 1000, by the first acoustic port 1004 and the second acoustic port 1005 via the first volume of air 1003. The air pathway has an impedance that is the serial addition of the first and second impedances of the first and second acoustic ports 1004 and 1005. In some applications, the air pathway might replace directly the rear vent of the headphone.

However, in the event that the "through" impedance of the air pathway is larger than required for a desired rear volume compliance of a loudspeaker in the headphone, the MEMS microphone assembly 1000 can be operated in parallel with a conventional resistive port, as shown in FIG. 3, to provide a suitable combined rear-vent impedance. If an earphone or headphone were to require a rear-vent resistance of 50 acoustic ohms, and a MEMS microphone assembly 1000 of the present disclosure had an acoustic resistance of 500 acoustic ohms, then, as shown in FIG. 3, it could be used in parallel with a rear-vent or acoustic vent 1200 having a resistance of 55.5 acoustic ohms, such that the parallel combination of the two would effectively provide the requisite rear-vent acoustic resistance of 50 ohms. In practice, however, the impedances for this type of application are not generally critical, and the use of the module in conjunction with an existing headphone rear-vent port, without change, might prove to be acceptable.

The acoustic vent 1200 arranged in parallel with the MEMS microphone assembly 1000 in the implementation shown in FIG. 3 is shown as a resistive couple—a port featuring an acoustic resistance overlay 1202. Other types of acoustic vents known by those skilled in the art may also be used, including those which are predominantly inertance in behavior, and also those featuring parallel combinations of an inertance couple (such as a short tube) and a resistance couple.

Figure 4A:
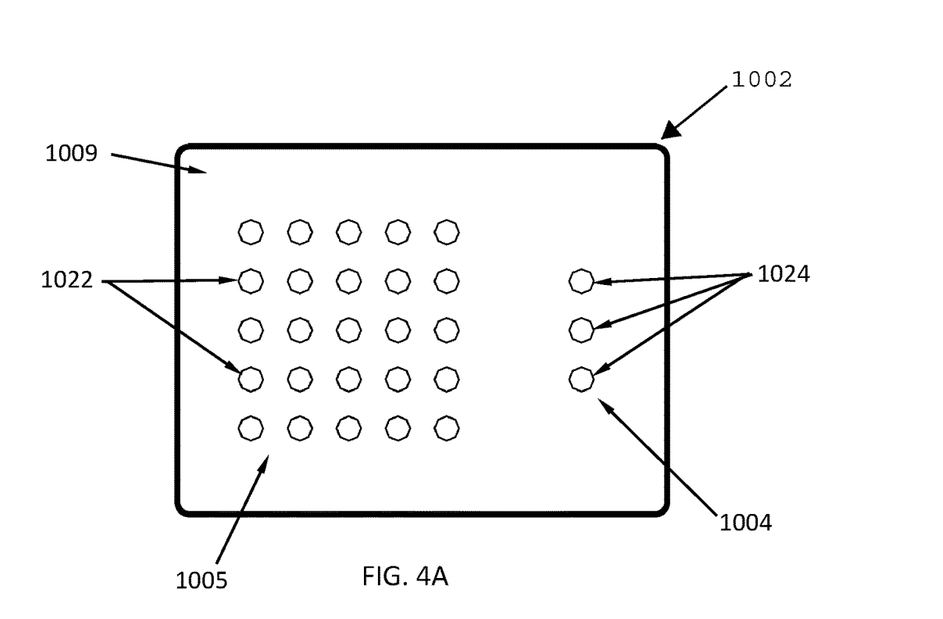
FIG. 4A shows a top view of an enclosure of a MEMS microphone assembly according to embodiments of the present disclosure.

Referring now to FIG. 4A, in an alternative embodiment of the present disclosure the first and second ports 1004, 1005 may both be formed in the same surface of the enclosure 1002. FIG. 4A shows a top plan view of an upper casing 1009 in which the first and second ports 1004, 1005 are formed. The first port 1004 is formed by 25 apertures 1022 formed in an array, while the second port 1005 is formed from 3 apertures 1024 formed in an array. All of the apertures 1022, 1024 have the same diameter, for instance 0.2 mm diameter though other diameters may be used. The acoustic impedances of the first and second ports 1004, 1005 provide a potentiometric ratio of {3/(3+25)}=0.107, or 8.3:1.

The apertures 1022 and 1024 may be formed by photo-lithographic etching techniques, laser machining, additive manufacturing methods or other suitable methods known to those in the art. An alternative method for fabrication cost is to punch the apertures mechanically. This is suitable for single apertures and small numbers of apertures, but it is not well suited to large arrays of closely spaced apertures.

Figure 4B:
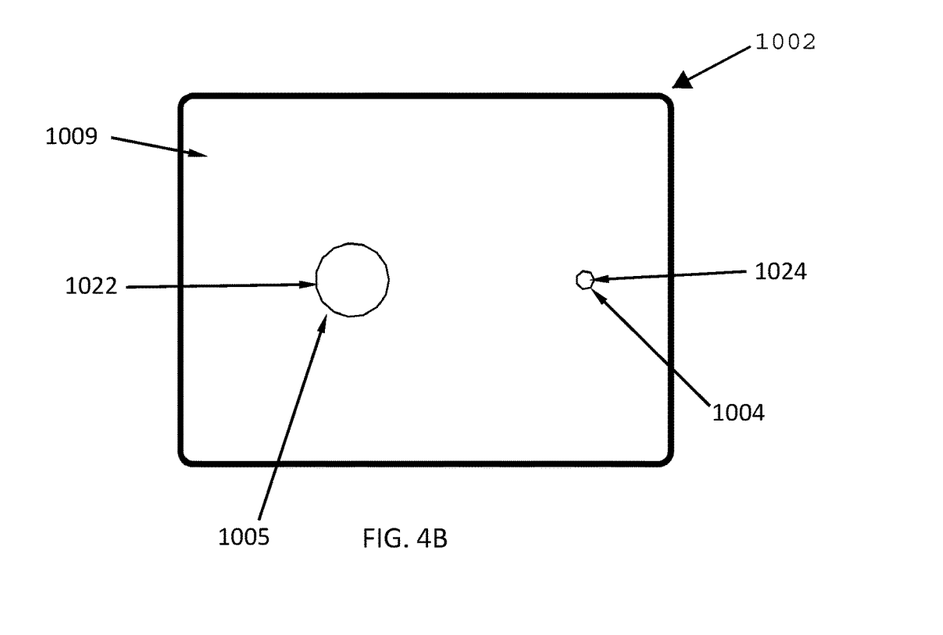
FIG. 4B shows a top view of another enclosure of a MEMS microphone assembly according to embodiments of the present disclosure.

Referring now to FIG. 4B, in an alternative embodiment of the present disclosure the first and second ports 1004, 1005 are both formed in the same surface of the enclosure 1002. Each of the first and second ports 1004, 1005 shown in FIG. 4B is formed by a single aperture 1024, 1022, respectively. FIG. 4B shows a top plan view of an upper casing 1009 in which the first and second ports 1004, 1005 are formed.

The apertures 1024, 1022 have different diameters so as to provide a required acoustic potentiometer ratio. In the example of FIG. 4B, the diameters of the first and second apertures are 0.15 mm and 0.60 mm respectively. If the upper casing 1009 were to have a thickness of 0.1 mm, then the acoustic impedances of the apertures 1024, 1022, at a frequency of 1 kHz, would be approximately 1372 acoustic ohms and 166 acoustic ohms respectively (in CGS units), providing a potentiometric ratio of 0.108, or 8.26:1.

As would be appreciated by those skilled in the art, in use, the MEMS microphone assembly 1000 with first and second ports 1004, 1005 formed on the same surface may be mounted such that the first and second ports are in communication with separate air volumes, such as by providing a gasket across the upper casing 1009 between the first and second ports 1004, 1005. The first and second ports 1004, 1005 are spaced apart to aid in this mounting.

The MEMS technology and packaging arrangements are ideal for implementing a module-type embodiment of the present disclosure, in which the microphone and its accompanying acoustic couples are provided as a single package to earphone and headphone manufacturers, such that there is no need for them to design and engineer the acoustic couples of the present disclosure themselves—the present disclosure is supplied as a single, well-defined, self-calibrating ANC microphone package.

In particular, the present disclosure relates to a miniature microphone assembly, or "package", that is especially useful for application in ambient noise-cancelling (ANC) earphones and headphones. The MEMS microphone assembly of the present disclosure may be applicable to headphones, earphones, and active noise cancellation (ANC) systems such as earpiece ANC system of a cellular-phone handset.

Where calibration of the MEMS microphone assembly 1000 is desired, UK patent publication GB2,538,432A, which is incorporated herein by reference in its entirety, describes a rapid calibration method that may be applicable to the MEMS microphone assembly 1000 to speed up production and enable ANC systems to be made in high volumes at low-cost. Any suitable calibration procedure known to those in the art may be adopted, however.

While the present disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the present disclosure without departing from the essential scope thereof. Therefore, it is intended that the present disclosure not be limited to the particular embodiments disclosed, but will include all embodiments falling within the scope thereof.

What is claimed is:

1. A micro-electro-mechanical (MEMS) microphone assembly comprising:
    an enclosure enclosing a first volume of air;
    a MEMS microphone chip provided within the enclosure;
    a first acoustic port formed in the enclosure, the first acoustic port defining a first fluid path between the first volume of air and ambient air outside the enclosure adjacent the first acoustic port, the first port having a first acoustic impedance; and
    a second acoustic port formed in the enclosure spaced apart from the first acoustic port, the second acoustic port defining a second fluid path between the first volume of air and ambient air outside the enclosure adjacent the second acoustic port, the second port having a second acoustic impedance.

2. The microphone assembly of claim 1 in which the first acoustic port comprises a single aperture formed in the enclosure.

3. The microphone assembly of claim 1 in which the first and second acoustic ports each comprise a single aperture formed in the enclosure.

4. The microphone assembly of claim 1 in which the second acoustic port comprises a plurality of apertures formed in the enclosure.

5. The microphone assembly of claim 2 in which the second acoustic port comprises a plurality of apertures formed in the enclosure.

6. The microphone assembly of claim 1 in which the first and second acoustic ports are both formed in the same surface of the enclosure.

7. The microphone assembly of claim 1 in which the first and second acoustic ports are formed in opposite surfaces of the enclosure.

8. The microphone assembly of claim 1 in which at least one of the first and second acoustic ports further comprises an acoustically resistive material.

9. The microphone assembly of claim 1 in which a ratio of the first and second acoustic impedances is at least 5:1.

10. The microphone assembly of claim 1 in which a ratio of the first and second acoustic impedances is at least 10:1.

11. The microphone assembly of claim 1 further comprising signal-processing circuitry provided within the enclosure.

12. An ambient noise-cancelling system, comprising:
    a micro-electro-mechanical (MEMS) microphone assembly, comprising:
        an enclosure enclosing a first volume of air;
        a MEMS microphone chip provided within the enclosure;
        a first acoustic port formed in the enclosure, the first acoustic port defining a first fluid path between the first volume of air and ambient air outside the enclosure adjacent the first acoustic port, the first port having a first acoustic impedance; and
        a second acoustic port formed in the enclosure spaced apart from the first acoustic port, the second acoustic port defining a second fluid path between the first volume of air and ambient air outside the enclosure adjacent the second acoustic port, the second port having a second acoustic impedance.

13. The ambient noise-cancelling system of claim 12, wherein the microphone assembly is incorporated in an earphone.

14. The ambient noise-cancelling system of claim 12, wherein the microphone assembly is incorporated in a headphone.

15. A cellular network phone handset, comprising:
    a micro-electro-mechanical (MEMS) microphone assembly, comprising:
        an enclosure enclosing a first volume of air;
        a MEMS microphone chip provided within the enclosure;
        a first acoustic port formed in the enclosure, the first acoustic port defining a first fluid path between the first volume of air and ambient air outside the enclosure adjacent the first acoustic port, the first port having a first acoustic impedance; and
a second acoustic port formed in the enclosure spaced apart from the first acoustic port, the second acoustic port defining a second fluid path between the first volume of air and ambient air outside the enclosure adjacent the second acoustic port, the second port having a second acoustic impedance.

* * * * *